(12) United States Patent
Aitken et al.

(10) Patent No.: US 9,530,910 B2
(45) Date of Patent: *Dec. 27, 2016

(54) FUSION FORMABLE SILICA AND SODIUM CONTAINING GLASSES

(71) Applicant: Corsam Technologies LLC, Corning, NY (US)

(72) Inventors: Bruce Gardiner Aitken, Corning, NY (US); James Edward Dickinson, Jr., Corning, NY (US); Timothy J. Kiczenski, Corning, NY (US)

(73) Assignee: CORSAM Technologies LLC, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/176,500

(22) Filed: Feb. 10, 2014

(65) Prior Publication Data

US 2014/0150867 A1    Jun. 5, 2014

Related U.S. Application Data

(63) Continuation of application No. 12/840,754, filed on Jul. 21, 2010, now Pat. No. 8,647,995.

(60) Provisional application No. 61/228,290, filed on Jul. 24, 2009, provisional application No. 61/263,930, filed on Nov. 24, 2009, provisional application No. 61/347,589, filed on May 24, 2010.

(51) Int. Cl.
| | |
|---|---|
| *C03C 3/091* | (2006.01) |
| *C03C 3/087* | (2006.01) |
| *C03C 3/085* | (2006.01) |
| *H01L 31/0352* | (2006.01) |
| *H01L 31/0392* | (2006.01) |

(52) U.S. Cl.
CPC ........... *H01L 31/0352* (2013.01); *C03C 3/085* (2013.01); *C03C 3/087* (2013.01); *C03C 3/091* (2013.01); *H01L 31/03923* (2013.01); *Y02E 10/541* (2013.01)

(58) Field of Classification Search
CPC .......... C03C 3/091; C03C 3/085; C03C 3/087; H01L 31/0352; H01L 31/03923; H01L 31/03925; Y02E 10/541
USPC ...... 501/66, 69, 70; 136/244, 256, 260, 261, 136/262, 263, 264, 265
See application file for complete search history.

(56) References Cited

U.S. PATENT DOCUMENTS

| | | | |
|---|---|---|---|
| 4,298,389 A | 11/1981 | Johnson | |
| 5,631,195 A | 5/1997 | Yanagisawa | |
| 5,780,373 A | 7/1998 | Yanagisawa | |
| 5,925,583 A | 7/1999 | Yoshii | |
| 6,207,603 B1 | 3/2001 | Danielson | |
| 6,251,812 B1 | 6/2001 | Koyama | |
| 6,319,867 B1 | 11/2001 | Chacon | |
| 6,365,534 B1 | 4/2002 | Koyama | |
| 6,417,124 B1 | 7/2002 | Peuchert | |
| 6,465,381 B1 | 10/2002 | Lautenschlager | |
| 6,680,266 B1 | 1/2004 | Peuchert | |
| 6,713,418 B2 | 3/2004 | Kishimoto et al. | |
| 6,753,279 B2 | 6/2004 | Kohli | |
| RE38,959 E | 1/2006 | Kohli | |
| 6,992,030 B2 | 1/2006 | Paulson | |
| 7,087,541 B2 | 8/2006 | Kohli | |
| 7,153,797 B2 | 12/2006 | Peuchert | |
| 7,273,668 B2 | 9/2007 | Kurachi et al. | |
| 7,666,511 B2 | 2/2010 | Ellison | |
| 7,767,607 B2 | 8/2010 | Kurachi et al. | |
| 7,863,515 B2 | 1/2011 | Ahn et al. | |
| 8,168,295 B2 | 5/2012 | Murata | |
| 8,349,454 B2 | 1/2013 | Murata et al. | |
| 8,647,995 B2* | 2/2014 | Aitken et al. | 501/69 |
| 2003/0109370 A1 | 6/2003 | Ikenishi | |
| 2004/0242396 A1 | 12/2004 | Hachitani | |
| 2006/0063009 A1 | 3/2006 | Naitou et al. | |
| 2006/0096635 A1 | 5/2006 | Tuttle | |
| 2007/0193623 A1 | 8/2007 | Krasnov | |
| 2008/0206494 A1 | 8/2008 | Kurachi | |
| 2008/0286548 A1* | 11/2008 | Ellison et al. | 428/220 |
| 2008/0308146 A1 | 12/2008 | Krasnov | |
| 2009/0197088 A1 | 8/2009 | Murata | |
| 2009/0215607 A1 | 8/2009 | Dejneka | |
| 2009/0220761 A1 | 9/2009 | Dejneka | |
| 2009/0275462 A1 | 11/2009 | Murata | |
| 2009/0325776 A1 | 12/2009 | Murata | |
| 2010/0087307 A1 | 4/2010 | Murata | |
| 2011/0094584 A1 | 4/2011 | Sawada | |

FOREIGN PATENT DOCUMENTS

| | | |
|---|---|---|
| DE | 10005088 | 3/2011 |
| EP | 1878709 | 1/2008 |

(Continued)

OTHER PUBLICATIONS

Machine Translation of JP 2004-131314, Apr. 30, 2004.*
Office Action in corresponding JP Application No. 2015-008530 dated Dec. 8, 2015 with English translation.
CN201080038266.5 Office action dated Jan. 14, 2014.
PCT/US10/043027 Search Report dated Nov. 30, 2010.

*Primary Examiner* — Elizabeth A Bolden
(74) *Attorney, Agent, or Firm* — Timothy M. Schaeberle (57) ABSTRACT

Sodium containing aluminosilicate and boroaluminosilicate glasses are described herein. The glasses can be used as substrates or superstrates for photovoltaic devices, for example, thin film photovoltaic devices such as CIGS photovoltaic devices. These glasses can be characterized as having strain points ≥535° C., for example, ≥570° C., thermal expansion coefficients of from 8 to 9 ppm/° C., as well as liquidus viscosities in excess of 50,000 poise. As such they are ideally suited for being formed into sheet by the fusion process.

27 Claims, 1 Drawing Sheet

(56) References Cited

FOREIGN PATENT DOCUMENTS

| | | |
|---|---|---|
| EP | 1118595 | 7/2011 |
| JP | 08133778 | 5/1996 |
| JP | 1997036400 | 2/1997 |
| JP | 2743333 | 6/1998 |
| JP | 10152339 | 6/1998 |
| JP | 11135819 | 5/1999 |
| JP | 11180727 | 7/1999 |
| JP | 11180728 | 7/1999 |
| JP | 11335133 | 7/1999 |
| JP | 11310433 | 9/1999 |
| JP | 11314933 | 11/1999 |
| JP | 2002175844 | 7/2000 |
| JP | 2001226137 | 8/2001 |
| JP | 2002003241 | 1/2002 |
| JP | 2002025762 | 1/2002 |
| JP | 2002053340 | 2/2002 |
| JP | 2003261352 | 9/2003 |
| JP | 2003335546 | 11/2003 |
| JP | 2004-043295 A | 2/2004 |
| JP | 2004131314 | 4/2004 |
| JP | 2004244257 | 9/2004 |
| JP | 2005-015328 A | 1/2005 |
| JP | 2007287926 | 11/2007 |
| JP | 2008069021 | 3/2008 |
| JP | 2008308343 | 12/2008 |
| JP | 2009-013052 A | 1/2009 |
| JP | 2009-057271 A | 3/2009 |
| JP | 2009084075 | 4/2009 |
| JP | 2009123962 | 6/2009 |
| JP | 2011226137 | 8/2011 |
| WO | 9827019 | 6/1998 |
| WO | 2008028599 | 3/2008 |
| WO | 2008149858 | 12/2008 |
| WO | 2009019965 | 2/2009 |
| WO | 2009154314 | 12/2009 |

* cited by examiner

FUSION FORMABLE SILICA AND SODIUM CONTAINING GLASSES

This application is a continuation of U.S. patent application Ser. No. 12/840,754 filed on Jul. 21, 2010 and claims the benefit of priority to U.S. Provisional Patent Application No. 61/228,290 filed on Jul. 24, 2009, to U.S. Provisional Patent Application No. 61/263,930 filed on Nov. 24, 2009, and to U.S. Provisional Patent Application No. 61/347,589 filed on May 24, 2010.

BACKGROUND

Field

Embodiments relate generally to sodium containing glasses and more particularly to fusion formable silica and sodium containing glasses which may be useful in photochromic, electrochromic, Organic Light Emitting Diode (OLED) lighting, or photovoltaic applications, for example, thin film photovoltaics.

Technical Background

Recent interest in the higher efficiencies offered by thin film photovoltaics has spawned considerable efforts into the development of new glass substrates and superstrates tailored to the needs of this new market. The thin film photovoltaics manufacturing processes typically require substrates capable of handling elevated temperatures for extended periods of time without warping, making glasses particularly well suited for these applications. Additionally, some thin film photovoltaic processes (such as CIGS) desire sodium to diffuse from the glass into the deposited layers, making sodium-containing glasses even more desirable for particular applications.

Existing glasses (such as soda lime or display compositions) have been used to demonstrate extremely high efficiencies in this field but the use of any glasses designed for other applications is wrought with problems. For example, soda lime glass offers a cheap, readily available sodium-containing substrate but its low strain point drastically inhibits its use in the higher temperature process that allow thin film photovoltaic processes to reach their highest efficiencies.

The use of glasses designed for display applications provides the required high strain point but the coefficient of thermal expansion (CTE) of these glasses is often too low to allow the reliable construction of large photovoltaic panels due to CTE mismatch with the photovoltaic films. Additionally, many glasses designed for display applications are intentionally alkali-free, making them less useful for those thin film photovoltaic applications desiring sodium diffusion from the glass.

In some thin film photovoltaic applications, it would be advantageous to have a sodium-containing glass sheet with a high strain point and a high CTE. Further, it would be advantageous to have a sodium-containing glass with a high strain point and high CTE that is fusion formable to allow processing into a flat sheet with optimal surface characteristics.

SUMMARY

A compositional range of fusion-formable, high strain point sodium-containing aluminosilicate and boroaluminosilicate glasses useful, for example, for thin-film photovoltaic applications are described herein. More specifically, these glasses are advantageous materials to be used in copper indium gallium diselenide (CIGS) photovoltaic modules where the sodium required to optimize cell efficiency is to be derived from the substrate glass. Current CIGS module substrates are typically made from soda-lime glass sheet that has been manufactured by the float process. However, use of higher strain point glass substrates can enable higher temperature CIGS processing, which is expected to translate into desirable improvements in cell efficiency. Moreover, it may be that the smoother surface of fusion-formed glass sheets yields additional benefits, such as improved film adhesion, etc.

Accordingly, the sodium-containing glasses described herein can be characterized by strain points ≥540° C., for example, ≥570° C. so as to provide advantage with respect to soda-lime glass and/or liquidus viscosity ≥50,000 poise to allow manufacture via the fusion process, for example, a liquidus viscosity of 130,000 poise or greater. In order to avoid thermal expansion mismatch between the substrate and CIGS layer, the inventive glasses, according to some embodiments, are further characterized by a thermal expansion coefficient in the range of from 8 to 9 ppm/° C.

One embodiment is a glass comprising, in weight percent:
50 to 72 percent $SiO_2$;
greater than 15 to 25 percent $Al_2O_3$;
0 to 10 percent $B_2O_3$;
10 to 25 percent total $M_2O$; and
greater than 0 to 25 percent total RO;
wherein, M is an alkali metal selected from Na, K, Li, Rb, and Cs and wherein the glass comprises at least 9 weight percent $Na_2O$, and wherein, R is an alkaline earth metal selected from Mg, Ca, Ba, and Sr.

Another embodiment is a glass comprising, in weight percent:
50 to 72 percent $SiO_2$;
10 to 25 percent $Al_2O_3$;
0 to 10 percent $B_2O_3$;
10 to 25 percent total $M_2O$; and
0.5 to less than 14 percent RO;
wherein, M is an alkali metal selected from Na, K, Li, Rb, and Cs and wherein the glass comprises at least 9 weight percent $Na_2O$, and wherein, R is an alkaline earth metal selected from Mg, Ca, Ba, and Sr.

Another embodiment is a photovoltaic device comprising, a glass comprising, in weight percent:
50 to 72 percent $SiO_2$;
10 to 25 percent $Al_2O_3$;
0 to 10 percent $B_2O_3$;
10 to 25 percent total $M_2O$; and
greater than 0 to 25 percent total RO;
wherein, M is an alkali metal selected from Na, K, Li, Rb, and Cs and wherein the glass comprises at least 9 weight percent $Na_2O$, and wherein, R is an alkaline earth metal selected from Mg, Ca, Ba, and Sr.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that both the foregoing general description and the following detailed description are merely exemplary of the invention, and are intended to provide an overview or framework to understanding the nature and character of the invention as it is claimed.

The accompanying drawings are included to provide a further understanding of the invention, and are incorporated in and constitute a part of this specification. The drawings illustrate one or more embodiment(s) of the invention and together with the description serve to explain the principles and operation of the invention.

BRIEF DESCRIPTION OF THE DRAWINGS

The invention can be understood from the following detailed description either alone or together with the accompanying drawings.

DETAILED DESCRIPTION

Reference will now be made in detail to various embodiments of the invention.

As used herein, the term "substrate" can be used to describe either a substrate or a superstrate depending on the configuration of the photovoltaic cell. For example, the substrate is a superstrate, if when assembled into a photovoltaic cell, it is on the light incident side of a photovoltaic cell. The superstrate can provide protection for the photovoltaic materials from impact and environmental degradation while allowing transmission of the appropriate wavelengths of the solar spectrum. Further, multiple photovoltaic cells can be arranged into a photovoltaic module. Photovoltaic device can describe either a cell, a module, or both.

As used herein, the term "adjacent" can be defined as being in close proximity. Adjacent structures may or may not be in physical contact with each other. Adjacent structures can have other layers and/or structures disposed between them.

One embodiment is a glass comprising, in weight percent:
50 to 72 percent $SiO_2$;
greater than 15 to 25 percent $Al_2O_3$;
0 to 10 percent $B_2O_3$;
10 to 25 percent total $M_2O$; and
greater than 0 to 25 percent total RO;
wherein, M is an alkali metal selected from Na, K, Li, Rb, and Cs and wherein the glass comprises at least 9 weight percent $Na_2O$, and wherein, R is an alkaline earth metal selected from Mg, Ca, Ba, and Sr.

Another embodiment is a glass comprising, in weight percent:
50 to 72 percent $SiO_2$;
10 to 25 percent $Al_2O_3$;
0 to 10 percent $B_2O_3$;
10 to 25 percent total $M_2O$; and
0.5 to less than 14 percent RO;
wherein, M is an alkali metal selected from Na, K, Li, Rb, and Cs and wherein the glass comprises at least 9 weight percent $Na_2O$, and wherein, R is an alkaline earth metal selected from Mg, Ca, Ba, and Sr.

Another embodiment is a photovoltaic device comprising, a glass comprising, in weight percent:
50 to 72 percent $SiO_2$;
10 to 25 percent $Al_2O_3$;
0 to 10 percent $B_2O_3$;
10 to 25 percent total $M_2O$; and
greater than 0 to 25 percent total RO;
wherein, M is an alkali metal selected from Na, K, Li, Rb, and Cs and wherein the glass comprises at least 9 weight percent $Na_2O$, and wherein, R is an alkaline earth metal selected from Mg, Ca, Ba, and Sr.

In another embodiment, the photovoltaic device comprises a glass consisting essentially of, in weight percent:
50 to 72 percent $SiO_2$;
10 to 25 percent $Al_2O_3$;
0 to 10 percent $B_2O_3$;
10 to 25 percent total $M_2O$; and
greater than 0 to 25 percent total RO;
wherein, M is an alkali metal selected from Na, K, Li, Rb, and Cs and wherein the glass comprises at least 9 weight percent $Na_2O$, and wherein, R is an alkaline earth metal selected from Mg, Ca, Ba, and Sr.

The photovoltaic device can comprise any of the described embodiments of the disclosed glasses. The glass can be in the form of a sheet and be either the substrate or superstrate or both of the photovoltaic device.

In another embodiment, the glass comprises, in weight percent:
50 to 72 percent $SiO_2$;
10 to 25 percent $Al_2O_3$;
0 to 10 percent $B_2O_3$;
10 to 25 percent total $M_2O$; and
greater than 0 to 25 percent total RO;
wherein, M is an alkali metal selected from Na, Li, Rb, and Cs wherein the glass comprises substantially no $K_2O$ and wherein the glass comprises 9 to 17 weight percent $Na_2O$, and wherein, R is an alkaline earth metal selected from Mg, Ca, Ba, and Sr.

In another embodiment, the glass consists essentially of, in weight percent:
50 to 72 percent $SiO_2$;
10 to 25 percent $Al_2O_3$;
0 to 10 percent $B_2O_3$;
10 to 25 percent total $M_2O$; and
greater than 0 to 25 percent total RO;
wherein, M is an alkali metal selected from Na, Li, Rb, and Cs wherein the glass comprises substantially no $K_2O$ and wherein the glass comprises 9 to 17 weight percent $Na_2O$, and wherein, R is an alkaline earth metal selected from Mg, Ca, Ba, and Sr.

In one embodiment, the glass comprises, in weight percent:
50 to 59 percent $SiO_2$;
10 to 25 percent $Al_2O_3$;
0 to 10 percent $B_2O_3$;
10 to 25 percent total $M_2O$; and
2 to 25 percent total RO;
wherein, M is an alkali metal selected from Na, K, Li, Rb, and Cs and wherein the glass comprises at least 9 weight percent $Na_2O$, and wherein, R is an alkaline earth metal selected from Mg, Ca, Ba, and Sr.

In another embodiment, the glass comprises, in weight percent:
54 to 59 percent $SiO_2$;
10 to 21 percent $Al_2O_3$;
0 to 10 percent $B_2O_3$;
10 to 25 percent total $M_2O$; and
2 to 25 percent total RO;
wherein, M is an alkali metal selected from Na, K, Li, Rb, and Cs and wherein the glass comprises at least 9 weight percent $Na_2O$, and wherein, R is an alkaline earth metal selected from Mg, Ca, Ba, and Sr.

According to another embodiment, the glass comprises, in weight percent:
54 to 59 percent $SiO_2$;
17 to 21 percent $Al_2O_3$;
0 to 10 percent $B_2O_3$;
10 to 25 percent total $M_2O$; and
2 to 25 percent total RO;
wherein, M is an alkali metal selected from Na, K, Li, Rb, and Cs and wherein the glass comprises at least 9 weight percent Na$_2$O, and wherein, R is an alkaline earth metal selected from Mg, Ca, Ba, and Sr.

According to another embodiment, the glass comprises, in weight percent:
- 52 to 59 percent SiO$_2$;
- 20 to 25 percent Al$_2$O$_3$;
- 0 to 10 percent B$_2$O$_3$;
- 10 to 25 percent total M$_2$O; and
- 2 to 25 percent total RO;

wherein, M is an alkali metal selected from Na, K, Li, Rb, and Cs and wherein the glass comprises at least 9 weight percent Na$_2$O, and wherein, R is an alkaline earth metal selected from Mg, Ca, Ba, and Sr.

In another embodiment, the glass consists essentially of, in weight percent:
- 54 to 59 percent SiO$_2$;
- 17 to 21 percent Al$_2$O$_3$;
- 0 to 10 percent B$_2$O$_3$;
- 10 to 25 percent total M$_2$O; and
- 2 to 25 percent total RO;

wherein, M is an alkali metal selected from Na, K, Li, Rb, and Cs and wherein the glass comprises at least 9 weight percent Na$_2$O; and wherein, R is an alkaline earth metal selected from Mg, Ca, Ba, and Sr.

In a further embodiment, the glass comprises, in weight percent:
- 56 to 58 percent SiO$_2$;
- 17 to 21 percent Al$_2$O$_3$;
- 0 to 10 percent B$_2$O$_3$;
- 10 to 25 percent total M$_2$O; and
- 2 to 25 percent total RO;

wherein, M is an alkali metal selected from Na, K, Li, Rb, and Cs and wherein the glass comprises at least 9 weight percent Na$_2$O, and wherein, R is an alkaline earth metal selected from Mg, Ca, Ba, and Sr.

In another embodiment, the glass consists essentially of, in weight percent:
- 50 to 59 percent SiO$_2$;
- 10 to 25 percent Al$_2$O$_3$;
- 0 to 10 percent B$_2$O$_3$;
- 10 to 25 percent total M$_2$O; and
- 2 to 25 percent total RO;

wherein, M is an alkali metal selected from Na, K, Li, Rb, and Cs and wherein the glass comprises at least 9 weight percent Na$_2$O, and wherein, R is an alkaline earth metal selected from Mg, Ca, Ba, and Sr.

In another embodiment, the glass consists essentially of, in weight percent:
- 52 to 59 percent SiO$_2$;
- 20 to 25 percent Al$_2$O$_3$;
- 0 to 10 percent B$_2$O$_3$;
- 10 to 25 percent total M$_2$O; and
- 2 to 25 percent total RO;

wherein, M is an alkali metal selected from Na, K, Li, Rb, and Cs and wherein the glass comprises at least 9 weight percent Na$_2$O, and wherein, R is an alkaline earth metal selected from Mg, Ca, Ba, and Sr.

In yet another embodiment, the glass consists essentially of, in weight percent:
- 56 to 58 percent SiO$_2$;
- 17 to 21 percent Al$_2$O$_3$;
- 0 to 10 percent B$_2$O$_3$;
- 10 to 25 percent total M$_2$O; and
- 2 to 25 percent total RO;

wherein, M is an alkali metal selected from Na, K, Li, Rb, and Cs and wherein the glass comprises at least 9 weight percent Na$_2$O, and wherein, R is an alkaline earth metal selected from Mg, Ca, Ba, and Sr.

In one embodiment, the glass consists essentially of, in weight percent:
- 54 to 59 percent SiO$_2$;
- 10 to 21 percent Al$_2$O$_3$;
- 0 to 10 percent B$_2$O$_3$;
- 10 to 25 percent total M$_2$O; and
- 2 to 25 percent total RO;

wherein, M is an alkali metal selected from Na, K, Li, Rb, and Cs and wherein the glass comprises at least 9 weight percent Na$_2$O, and wherein, R is an alkaline earth metal selected from Mg, Ca, Ba, and Sr.

According to one embodiment, the glass comprises 55 to 72 weight percent SiO$_2$, for example, 51 to 72 weight percent SiO$_2$, for example, 52 to 72 weight percent SiO$_2$, for example, 53 to 72 weight percent SiO$_2$, for example, 54 to 72 weight percent SiO$_2$, for example, 55 to 72 weight percent SiO$_2$, for example, 56 to 72 weight percent SiO$_2$, for example, 57 to 72 weight percent SiO$_2$, for example, 58 to 72 weight percent SiO$_2$, for example, 59 to 72 weight percent SiO$_2$, for example, 60 to 72 weight percent SiO$_2$. In one embodiment, the glass comprises 55 to 72 weight percent SiO$_2$ and comprises greater than 15 to 25 weight percent Al$_2$O$_3$.

The glass, in one embodiment, is rollable. The glass, in one embodiment, is down-drawable. The glass can be slot drawn or fusion drawn, for example. According to another embodiment the glass can be float formed.

The glass, according to one embodiment, comprises less than 8 weight percent K$_2$O, for example, less than 7 weight percent K$_2$O, for example, less than 6 weight percent K$_2$O, less than 5 weight percent K$_2$O, less than 4 weight percent K$_2$O, for example, less than 3 weight percent K$_2$O. The glass, according to some embodiments, comprises substantially no K$_2$O, for example, is substantially K$_2$O free.

According to one embodiment, the glass comprises less than 4 weight percent K$_2$O, and the glass has a strain point of 535° C. or greater, a coefficient of thermal expansion of 50×10$^{-7}$ or greater, and has a liquidus viscosity of 130,000 poise or greater, for example, 150,000 poise or greater. The glass having these properties, in one embodiment, is fusion formable.

The glass, according to one embodiment, comprises less than 4 weight percent K$_2$O and less than 2.5 weight percent MgO. In one embodiment, the glass comprises less than 4 weight percent K$_2$O and less than 2.5 weight percent MgO and has a strain point of 535° C. or greater, a coefficient of thermal expansion of 50×10$^{-7}$ or greater, and a liquidus viscosity of 130,000 poise or greater, for example, 150,000 poise or greater. The glass having these properties, in one embodiment, is fusion formable.

Some embodiments of the disclosed glasses have the advantage of a high Na$_2$O content, making them capable of delivering more Na to a deposited CIGS layer during fabrication of photovoltaic cells—which in turn is expected to lead to higher CIGS cell efficiency. Finally, as Na out-diffusion during CIGS deposition/crystallization may possibly be impeded by the presence of another alkali, the fact that some examples are K-free or have substantially reduced K$_2$O content may provide yet another advantage.

The glass can further comprise 3 weight percent or less, for example, 0 to 3 weight percent, for example, greater than 0 to 3 weight percent, for example, 1 to 3 weight percent of TiO$_2$, MnO, ZnO, Nb$_2$O$_5$, MoO$_3$, Ta$_2$O$_5$, WO$_3$, ZrO$_2$, Y$_2$O$_3$, La$_2$O$_3$, HfO$_2$, CdO, SnO$_2$, Fe$_2$O$_3$, CeO$_2$, As$_2$O$_3$, Sb$_2$O$_3$, Cl, Br, or combinations thereof. The glass, in one embodiment, comprises 3 weight percent or less, for example, 0 to 3 weight percent, for example, greater than 0 to 3 weight percent, for example, 1 to 3 weight percent of $TiO_2$ or $ZrO_2$.

As mentioned above, the glasses, according some embodiments, comprise 0 to 10 weight percent, for example, 1 to 8 weight percent or for example, greater than 0 to 10 weight percent $B_2O_3$, for example, 0.5 to 10 weight percent $B_2O_3$, for example 1 to 10 weight percent $B_2O_3$. $B_2O_3$ is added to the glass to reduce melting temperature, to decrease liquidus temperature, to increase liquidus viscosity, and to improve mechanical durability relative to a glass containing no $B_2O_3$. In one embodiment, the glass is substantially $B_2O_3$ free.

The glass, according to one embodiment, comprises greater than 0 to 25 percent RO, for example, 0.5 to 25 percent RO, for example, 1 to 25 percent RO wherein, R is an alkaline earth metal. The glass, according to one embodiment, comprises less than 14 percent RO, for example, 13 or less, for example, 12 or less, for example, 11 or less, for example, 10 or less, for example, 9 or less, for example, 8 or less. In one embodiment, the glass comprises 0.5 to less than 14 percent RO, for example, 0.5 to 13 percent RO. The glass, according to one embodiment, comprises greater than 2 to 25 percent RO, for example, wherein R is an alkaline earth metal.

According to one embodiment, the glass comprises 0.5 to less than 14 percent RO, and the glass has a strain point of 535° C. or greater, a coefficient of thermal expansion of $50 \times 10^{-7}$ or greater, and has a liquidus viscosity of 130,000 poise or greater, for example, 150,000 poise or greater. The glass having these properties, in one embodiment, is fusion formable.

The glass, according to some embodiments, comprises less than 4.0 weight percent MgO, for example, less than 3.0 weight percent MgO, for example, less than 2.5 weight percent MgO, less than 2.0 weight percent MgO. The glass can comprise, for example, 0 to 4 weight percent MgO, for example, greater than 0 to 4 weight percent MgO, for example, greater than 0 to 3 weight percent MgO, for example, greater than 0 to 2.5 weight percent MgO, for example, 0.2 to 4 weight percent MgO, for example, 0.2 to 3 weight percent MgO, for example, 0.2 to 2.5 weight percent MgO. According to another embodiment, the glass comprises, for example, 1 to 3 weight percent MgO. MgO can be added to the glass to reduce melting temperature and to increase strain point. It can disadvantageously lower CTE relative to other alkaline earths (e.g., CaO, SrO, BaO), and so other adjustments may be made to keep the CTE within the desired range. Examples of suitable adjustments include increase SrO at the expense of CaO, increasing alkali oxide concentration, and replacing a smaller alkali oxide (e.g., $Na_2O$) in part with a larger alkali oxide (e.g., $K_2O$).

According to one embodiment, the glass comprises less than 2.5 weight percent MgO, and the glass has a strain point of 535° C. or greater, a coefficient of thermal expansion of $50 \times 10^{-7}$ or greater, and has a liquidus viscosity of 130,000 poise or greater, for example, 150,000 poise or greater. The glass having these properties, in one embodiment, is fusion formable.

According to another embodiment, the glass is substantially free of BaO. For example, the content of BaO can be 0.05 weight percent or less, for example, zero weight percent.

In some embodiments, the glass is substantially free of $Sb_2O_3$, $As_2O_3$, or combinations thereof, for example, the glass comprises 0.05 weight percent or less of $Sb_2O_3$ or $As_2O_3$ or a combination thereof. For example, the glass can comprise zero weight percent of $Sb_2O_3$ or $As_2O_3$ or a combination thereof.

The glasses, in some embodiments, comprise 2 to 4 weight percent CaO. Relative to alkali oxides or SrO, CaO contributes to higher strain point, lower density, and lower melting temperature. It is a primary component of certain possible devitrification phases, particularly anorthite ($CaAl_2Si_2O_8$), and this phase has complete solid solution with an analogous sodium phase, albite ($NaAlSi_3O_8$). High Na and Ca contents taken alone can cause liquidus temperatures to be unacceptably high. However, the chemical sources for CaO include limestone, a very inexpensive material, so to the extent that high volume and low cost are factors, it is typically useful to make the CaO content as high as can be reasonably achieved relative to other alkaline earth oxides.

The glasses can comprise, in some embodiments, 0.2 to 4 weight percent SrO, for example, 0.5 to 4 weight percent, for example 1 to 4, for example, 2 to 4 weight percent SrO. In certain embodiments, the glass contains no deliberately batched SrO, though it may of course be present as a contaminant in other batch materials. SrO contributes to higher coefficient of thermal expansion, and the relative proportion of SrO and CaO can be manipulated to improve liquidus temperature, and thus liquidus viscosity. SrO is not as effective as CaO or MgO for improving strain point, and replacing either of these with SrO tends to cause the melting temperature to increase.

Also as mentioned above, the glasses, according to some embodiments, include 10 to 25 percent $M_2O$, wherein M is one of the alkali cations Li, Na, K, Rb and Cs. The alkali cations raise the CTE steeply, but also lower the strain point and, depending upon how they are added, increase melting temperatures. The least effective alkali oxide for CTE is $Li_2O$, and the most effective alkali oxide is $Cs_2O$. As noted above, sodium can participate in one of the possible devitrification phases of the inventive glasses, and while adjustments in other components can be used to counteract this, e.g., changing the CaO/(CaO+SrO) ratio, this tendency may make it advantageous to replace sodium with other alkalis, or to use a mix of alkalis instead of sodium alone. If high volume and low cost are important, then it is desirable to as much as possible confine the alkali oxides to $Na_2O$ and $K_2O$ or combinations thereof.

According to some embodiments, the glass comprises 9 to 17 percent $Na_2O$, for example, 10 to 16 percent $Na_2O$. In one embodiment, the glass comprises 9 weight percent or more $Na_2O$, for example, 9 to 12 weight percent $Na_2O$.

The glass, according to some embodiments, is down-drawable; that is, the glass is capable of being formed into sheets using down-draw methods such as, but not limited to, fusion draw and slot draw methods that are known to those skilled in the glass fabrication arts. Such down-draw processes are used in the large-scale manufacture of ion-exchangeable flat glass.

The glass, according to one embodiment, comprises 10 to 30 weight percent $Al_2O_3+B_2O_3$.

The glass, according to one embodiment, comprises 20 to 30 weight percent $Al_2O_3+B_2O_3$.

The glass, according to one embodiment, comprises 21 to 25 weight percent $Al_2O_3$.

The glass, according to one embodiment, comprises 10 to 21 weight percent $Al_2O_3+B_2O_3$.

The glass, according to one embodiment, comprises 17 to 21 weight percent $Al_2O_3+B_2O_3$.

The glass, according to one embodiment, comprises greater than 15 to 25 weight percent $Al_2O_3$, for example, 16 or greater to 25 weight percent, for example, 16 to 24 weight percent $Al_2O_3$ or, for example, 17 to 25 weight percent $Al_2O_3$, for example, 17 to 21 weight percent $Al_2O_3$.

According to one embodiment, the glass comprises greater than 15 to 25 weight percent $Al_2O_3$, has a strain point of 535° C. or greater, a coefficient of thermal expansion of $50\times10^{-7}$ or greater, and a liquidus viscosity of 130,000 poise or greater, for example, 150,000 poise or greater. The glass having these properties, in one embodiment, is fusion formable.

The glass, according to one embodiment, comprises greater than 15 to 25 percent $Al_2O_3$ and comprises 0.5 to less than 14 percent RO. In one embodiment, the glass comprises greater than 15 to 25 percent $Al_2O_3$, 0.5 to less than 14 percent RO, has a strain point of 535° C. or greater, a coefficient of thermal expansion of $50\times10^{-7}$ or greater, and a liquidus viscosity of 130,000 poise or greater, for example, 150,000 poise or greater. The glass having these properties, in one embodiment, is fusion formable.

The glass, according to one embodiment, comprises:
9 to 12 percent $Na_2O$;
2 to 8 percent $K_2O$;
2 to 8 percent CaO;
2 to 4 percent SrO; and
1 to 3 percent MgO.

The fusion draw process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank. These outside surfaces extend down and inwardly so that they join at an edge below the drawing tank. The two flowing glass surfaces join at this edge to fuse and form a single flowing sheet. The fusion draw method offers the advantage that, since the two glass films flowing over the channel fuse together, neither outside surface of the resulting glass sheet comes in contact with any part of the apparatus. Thus, the surface properties are not affected by such contact.

The slot draw method is distinct from the fusion draw method. Here the molten raw material glass is provided to a drawing tank. The bottom of the drawing tank has an open slot with a nozzle that extends the length of the slot. The molten glass flows through the slot/nozzle and is drawn downward as a continuous sheet therethrough and into an annealing region. Compared to the fusion draw process, the slot draw process provides a thinner sheet, as only a single sheet is drawn through the slot, rather than two sheets being fused together, as in the fusion down-draw process.

In order to be compatible with down-draw processes, the aluminoborosilicate glass described herein has a high liquidus viscosity. In one embodiment, the glass has a liquidus viscosity of 50,000 poise or greater, for example, 150,000 poise or greater, for example, 200,000 poise or greater, for example, 250,000 poise or greater, for example, 300,000 poise or greater, for example, 350,000 poise or greater, for example, 400,000 poise or greater, for example, greater than or equal to 500,000 poise. The liquidus viscosities of some exemplary glasses could be closely correlated with the difference between the liquidus temperature and the softening point.

In one embodiment, the glass has a strain point of 535° C. or greater, for example, 540° C. or greater, for example, a strain point of 560° C. or greater, for example, a strain point of 570° C. or greater, for example, 580° C. or greater. In some embodiments, the glass has a coefficient of thermal expansion of $50\times10^{-7}$ or greater, for example, $60\times10^{-7}$ or greater, for example, $70\times10^{-7}$ or greater, for example, $80\times10^{-7}$ or greater. In one embodiment, the glass has a coefficient of thermal expansion of from $50\times10^{-7}$ to $90\times10^{-7}$.

In one embodiment, the glass has a strain point of 535° C. or greater, a coefficient of thermal expansion of $50\times10^{-7}$ or greater, and has a liquidus viscosity of 150,000 poise or greater. The glass having these properties, in one embodiment, is fusion formable.

In one embodiment, the glass has a coefficient of thermal expansion of $50\times10^{-7}$ or greater and a strain point of 535° C. or greater. In one embodiment, the glass has a coefficient of thermal expansion of $50\times10^{-7}$ or greater and a strain point of 540° C. or greater. In one embodiment, the glass has a coefficient of thermal expansion of $60\times10^{-7}$ or greater and a strain point of 560° C. or greater. In one embodiment, the glass has a coefficient of thermal expansion of $60\times10^{-7}$ or greater and a strain point of 580° C. or greater. In one embodiment, the glass has a coefficient of thermal expansion of $50\times10^{-7}$ or greater and a strain point of 570° C. or greater. In one embodiment, the glass has a coefficient of thermal expansion of $70\times10^{-7}$ or greater and a strain point of 570° C. or greater. Embodiments of the described glasses can have several combinations of properties within the disclosed ranges. It should be appreciated that all of the possible combinations are not listed herein.

According to one embodiment, the glass is ion exchanged in a salt bath comprising one or more salts of alkali ions. The glass can be ion exchanged to change its mechanical properties. For example, smaller alkali ions, such as lithium or sodium, can be ion-exchanged in a molten salt containing one or more larger alkali ions, such as sodium, potassium, rubidium or cesium. If performed at a temperature well below the strain point for sufficient time, a diffusion profile will form in which the larger alkali moves into the glass surface from the salt bath, and the smaller ion is moved from the interior of the glass into the salt bath. When the sample is removed, the surface will go under compression, producing enhanced toughness against damage. Such toughness may be desirable in instances where the glass will be exposed to adverse environmental conditions, such as photovoltaic grids exposed to hail. A large alkali already in the glass can also be exchanged for a smaller alkali in a salt bath. If this is performed at temperatures close to the strain point, and if the glass is removed and its surface rapidly reheated to high temperature and rapidly cooled, the surface of the glass will show considerable compressive stress introduced by thermal tempering. This will also provide protection against adverse environmental conditions. It will be clear to one skilled in the art that any monovalent cation can be exchanged for alkalis already in the glass, including copper, silver, thallium, etc., and these also provide attributes of potential value to end uses, such as introducing color for lighting or a layer of elevated refractive index for light trapping.

According to another embodiment, the glass can be float formed as known in the art of float forming glass.

In one embodiment, the glass is in the form of a sheet. The glass in the form of a sheet can be thermally tempered.

In one embodiment, an Organic Light Emitting Diode device comprises the glass in the form of a sheet.

The glass, according to one embodiment, is transparent. The glass sheet, according to one embodiment, is transparent.

Figure 1:
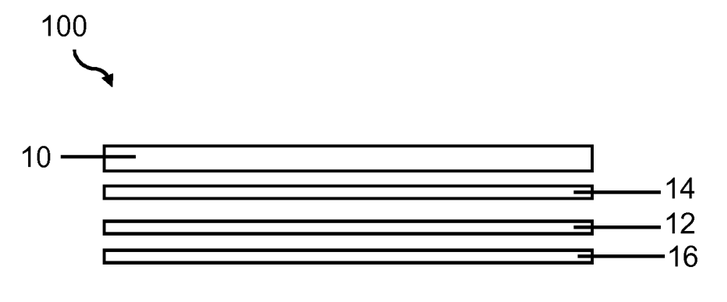
FIG. 1 is an illustration of features of a photovoltaic device according to one embodiment.

FIG. 1 is an illustration of features 100 of a photovoltaic device according to one embodiment. In one embodiment, a photovoltaic device comprises the glass in the form of a sheet. The photovoltaic device can comprise more than one of the glass sheets, for example, as a substrate and/or as a superstrate. In one embodiment, the photovoltaic device comprises the glass sheet 10 as a substrate and/or superstrate, a conductive material 12 located adjacent to the substrate, and an active photovoltaic medium 16 adjacent to the conductive material. In one embodiment, the active photovoltaic medium comprises a copper indium gallium diselenide (CIGS) layer. In one embodiment, the active photovoltaic medium comprises a cadmium telluride (CdTe) layer. In one embodiment, the active photovoltaic medium is a CIGS layer. In one embodiment, the active photovoltaic medium is a cadmium telluride (CdTe) layer.

The photovoltaic device, according to one embodiment, further comprises a barrier layer 14 disposed between the superstrate or substrate and the active photovoltaic medium. In one embodiment, the photovoltaic device further comprises a barrier layer disposed between or adjacent to the superstrate or substrate and a transparent conductive oxide (TCO) layer, wherein the TCO layer is disposed between or adjacent to the active photovoltaic medium and the barrier layer. A TCO may be present in a photovoltaic device comprising a CdTe functional layer. In one embodiment, the barrier layer is disposed directly on the glass. The barrier layer can effect the migration of alkali ions from the glass into other layers of the device, for example, the active photovoltaic medium, for example, increase, decrease, or meter the migration.

In one embodiment, the glass sheet is transparent. In one embodiment, the glass sheet as the substrate and/or superstrate is transparent.

According to some embodiments, the glass sheet has a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, 0.5 mm to 2.0 mm, for example, 0.5 mm to 1.1 mm, for example, 0.7 mm to 1.1 mm. Although these are exemplary thicknesses, the glass sheet can have a thickness of any numerical value including decimal places in the range of from 0.1 mm up to and including 4.0 mm.

In one embodiment, an electrochromic device comprises the glass in the form of a sheet. The electrochromic device can be, for example, an electrochromic window. In one embodiment, the electrochromic window comprises one or more of the glass sheets, such as in a single, double, or triple pane window.

The fusion formable glasses of this invention, by virtue of their relatively high strain point, represent advantaged substrate materials for CIGS photovoltaic modules. When manufactured by the fusion process, their superior surface quality relative to that of float glass may also result in further improvements to the photovoltaic module making process. Advantageous embodiments of this invention are characterized by liquidus viscosity in excess of 400,000 poise, thereby enabling the fabrication of the relatively thick glass sheets that may be advantageous for some module manufacturers.

EXAMPLES

The following is an example of how to fabricate a sample of an exemplary glass, according to one embodiment of the invention, as shown in Table 1. This composition corresponds to Example number 1 shown in Table 3.

TABLE 1

| oxide | mol % |
|---|---|
| $SiO_2$ | 63.64 |
| $Al_2O_3$ | 13.00 |
| MgO | 3.14 |
| CaO | 3.15 |
| SrO | 1.56 |
| $Na_2O$ | 11.32 |
| $K_2O$ | 4.09 |
| $SnO_2$ | 0.10 |

In some embodiments, the total does not add up to 100%, since certain tramp elements are present at non-negligible concentrations.

Batch materials, as shown in Table 2 were weighed and added to a 4 liter plastic container:

TABLE 2

| Batch Components | batch weight |
|---|---|
| sand | 1322.67 |
| alumina | 473.03 |
| Magnesia | 45.22 |
| Limestone | 115.32 |
| Strontium carbonate | 83.32 |
| Soda ash | 425.20 |
| Potassium carbonate | 202.74 |
| 10% $SnO_2$ and 90% sand | 52.8 |

It should be appreciated that in the batch, limestone, depending on the source can contain tramp elements and/or vary amounts of one or more oxides, for example, MgO and/or BaO. The sand is advantageously beneficiated so that at least 80% by mass passes 60 mesh, for example 80 mesh, for example 100 mesh. The $SnO_2$ added, in this example, was pre-mixed with sand at a level of 10% by weight so as to ensure homogeneous mixing with the other components. The bottle containing the batch materials was mounted to a tumbler and the batch materials were mixed so as to make a homogeneous batch and to break up soft agglomerates. The mixed batch was transferred to a 1800 cc platinum crucible and placed into a high-temperature ceramic backer. The platinum in its backer was loaded into a glo-bar furnace idling at a temperature of 1630° C. After 16 hours, the crucible+backer was removed and the glass melt was poured onto a cold surface, such as a steel plate, to form a patty, and then transferred to an annealer held at a temperature of 640° C. The glass patty was held at the annealer temperature for 2 hours, then cooled at a rate of 1° C. per minute to room temperature.

Table 3, Table 4, Table 5, Table 6, Table 7, Table 8, Table 9, Table 10, Table 11, and Table 12 show exemplary glasses, according to embodiments of the invention, and made according to the above example. Properties data for some exemplary glasses are also shown in Table 3, Table 4, Table 5, Table 6, Table 7, Table 8, Table 9, Table 10, Table 11, and Table 12. In the Tables $T_{str}$(° C.) is the strain point which is the temperature when the viscosity is equal to $10^{14.7}$ P as measured by beam bending or fiber elongation. $T_{ann}$(° C.) is the annealing point which is the temperature when the viscosity is equal to $10^{13.18}$ P as measured by beam bending or fiber elongation. $T_s$(° C.) is the softening point which is the temperature when the viscosity is equal to $10^{7.6}$ P as measured by beam bending or fiber elongation. $\alpha(10^{-7}/°$ C.) or $\alpha(10^{-7}/°$ C.) in the Tables is the coefficient of thermal expansion (CTE) which is the amount of dimensional change from either 0 to 300° C. or 25 to 300° C. depending on the measurement. CTE is typically measured by dilatometry. □(g/cc) is the density which is measured with the Archimedes method (ASTM C693). $T_{200}$(° C.) is the two-hundred Poise (P) temperature. This is the temperature when the viscosity of the melt is 200 P as measured by HTV (high temperature viscosity) measurement which uses concentric cylinder viscometry. $T_{liq}$(° C.) is the liquidus temperature. This is the temperature where the first crystal is observed in a standard gradient boat liquidus measurement (ASTM C829-81). Generally this test is 72 hours but can be as short as 24 hours to increase throughput at the expense of accuracy (shorter tests could underestimate the liquidus temperature). $\eta_{liq}$(° C.) is the liquidus viscosity. This is the viscosity of the melt corresponding to the liquidus temperature.

TABLE 3

| | Example | | | | | |
|---|---|---|---|---|---|---|
| | 1 | 2 | 3 | 4 | 5 | 6 |
| Composition (mol %) | | | | | | |
| $Na_2O$ | 11.32 | 10.30 | 12.30 | 11.32 | 11.32 | 11.32 |
| $K_2O$ | 4.09 | 5.11 | 3.11 | 3.09 | 2.09 | 4.09 |
| MgO | 3.14 | 3.14 | 3.14 | 3.54 | 3.94 | 3.94 |
| CaO | 3.14 | 3.14 | 3.14 | 3.54 | 3.94 | 3.94 |
| SrO | 1.57 | 1.57 | 1.57 | 1.77 | 1.97 | 1.97 |
| $Al_2O_3$ | 13.00 | 13.00 | 13.00 | 13.00 | 13.00 | 12.00 |
| $SiO_2$ | 63.63 | 63.63 | 63.63 | 63.63 | 63.63 | 62.63 |
| $SnO_2$ | 0.10 | 0.10 | 0.10 | 0.10 | 0.10 | 0.10 |
| Composition (wt %) | | | | | | |
| $Na_2O$ | 10.40 | 9.43 | 11.40 | 10.50 | 10.50 | 10.50 |
| $K_2O$ | 5.74 | 7.13 | 4.38 | 4.36 | 2.96 | 5.78 |
| MgO | 1.89 | 1.88 | 1.89 | 2.14 | 2.39 | 2.38 |
| CaO | 2.63 | 2.62 | 2.64 | 2.98 | 3.33 | 3.32 |
| SrO | 2.42 | 2.41 | 2.43 | 2.75 | 3.07 | 3.06 |
| $Al_2O_3$ | 19.70 | 19.60 | 19.80 | 19.80 | 19.90 | 18.30 |
| $SiO_2$ | 56.90 | 56.60 | 57.20 | 57.20 | 57.50 | 56.40 |
| $SnO_2$ | 0.22 | 0.22 | 0.23 | 0.23 | 0.23 | 0.23 |
| $T_{str}$ (° C.) | 595 | 591 | 583 | 593 | 603 | 570 |
| $T_{ann}$ (° C.) | 644 | 642 | 635 | 646 | 656 | 621 |
| □ ($10^{-7}$/° C.) | 87.9 | 90.2 | 88.2 | 83.6 | 80.5 | 89.8 |
| □ (gm/cc) | 2.513 | 2.509 | 2.512 | 2.519 | 2.527 | 2.534 |
| $T_{200}$ (° C.) | 1630 | | | | | |
| $T_{liq}$ (° C.) | 1025 | 1045 | 1025 | 1055 | 1090 | 1040 |
| □$_{liq}$ (kp) | 546 | | | | | |

TABLE 4

| | Example | | | | |
|---|---|---|---|---|---|
| | 7 | 8 | 9 | 10 | 11 |
| Composition (mol %) | | | | | |
| $Na_2O$ | 11.32 | 11.32 | 11.32 | 11.09 | 10.87 |
| $K_2O$ | 4.09 | 4.09 | 4.09 | 4.01 | 3.93 |
| MgO | 3.14 | 3.14 | 3.14 | 3.08 | 3.01 |
| CaO | 3.15 | 3.15 | 3.15 | 3.09 | 3.02 |
| SrO | 1.56 | 1.56 | 1.56 | 1.53 | 1.5 |
| $Al_2O_3$ | 11.00 | 9.00 | 7.00 | 12.74 | 12.48 |
| $SiO_2$ | 63.63 | 63.63 | 63.63 | 62.36 | 61.09 |
| $SnO_2$ | 0.10 | 0.10 | 0.10 | 0.10 | 0.10 |
| $B_2O_3$ | 2.00 | 4.00 | 6.00 | 2.00 | 4.00 |
| $(RO + R2O)/Al_2O_3$ | 2.11 | 2.58 | 3.32 | 1.79 | 1.79 |
| $R_2O/RO$ | 1.96 | 1.96 | 1.96 | 1.96 | 1.97 |
| $(RO + R_2O)/Al_2O_3 + B_2O_3$ | 1.79 | 1.79 | 1.79 | 1.55 | 1.35 |
| $R_2O/Al_2O_3 + B_2O_3$ | 1.19 | 1.19 | 1.19 | 1.02 | 0.90 |
| Composition (wt %) | | | | | |
| $Na_2O$ | 10.51 | 10.61 | 10.72 | 10.19 | 9.98 |
| $K_2O$ | 5.79 | 5.85 | 5.91 | 5.62 | 5.51 |
| MgO | 1.90 | 1.92 | 1.94 | 1.85 | 1.80 |
| CaO | 2.66 | 2.68 | 2.71 | 2.58 | 2.52 |
| SrO | 2.43 | 2.45 | 2.48 | 2.36 | 2.31 |
| $Al_2O_3$ | 16.86 | 13.93 | 10.94 | 19.32 | 18.91 |
| $SiO_2$ | 57.47 | 58.04 | 58.61 | 55.73 | 54.55 |
| $SnO_2$ | 0.23 | 0.23 | 0.23 | 0.22 | 0.22 |
| $B_2O_3$ | 2.09 | 4.23 | 6.41 | 2.07 | 4.14 |
| $T_{str}$ (° C.) | 550 | 539 | 537 | 566 | 550 |
| $T_{ann}$ (° C.) | 595 | 582 | 579 | 614 | 595 |
| □ ($10^{-7}$/° C.) | 90.4 | 87.7 | 83.6 | 90.2 | 87.5 |
| □ (gm/cc) | 2.503 | 2.500 | 2.494 | 2.507 | 2.494 |
| $T_{200}$ (° C.) | 1574 | | | 1583 | |
| $T_{liq}$ (° C.) | | | | | |
| □$_{liq}$ (kp) | 389 | | | 323 | |

TABLE 5

| | Example | | | | | | | |
|---|---|---|---|---|---|---|---|---|
| | 12 | 13 | 14 | 15 | 16 | 17 | 18 | 19 |
| Composition (mol %) | | | | | | | | |
| $Na_2O$ | 10.93 | 11.06 | 11.19 | 11.19 | 11.06 | 10.93 | 10.93 | 10.93 |
| $K_2O$ | 3.95 | 3.99 | 4.04 | 4.04 | 3.99 | 3.95 | 3.95 | 3.95 |
| MgO | 0 | 0 | 0 | 3.11 | 3.07 | 3.03 | 0 | 0 |
| CaO | 7.59 | 7.68 | 7.77 | 3.11 | 3.07 | 3.04 | 7.59 | 7.59 |
| SrO | 0 | 0 | 0 | 1.55 | 1.54 | 1.52 | 0 | 0 |
| $B_2O_3$ | 0 | 0 | 0 | 0 | 0 | 0 | 1.00 | 2.00 |
| $Al_2O_3$ | 16.00 | 15.00 | 14.00 | 14.00 | 15.00 | 16.00 | 16.00 | 16.00 |
| $SiO_2$ | 61.43 | 62.17 | 62.9 | 62.9 | 62.17 | 61.43 | 60.43 | 59.43 |
| $SnO_2$ | 0.10 | 0.10 | 0.10 | 0.10 | 0.10 | 0.10 | 0.10 | 0.10 |
| Composition (wt %) | | | | | | | | |
| $Na_2O$ | 9.92 | 10.10 | 10.30 | 10.20 | 10.10 | 9.88 | 9.90 | 9.89 |
| $K_2O$ | 5.46 | 5.55 | 5.66 | 5.63 | 5.53 | 5.44 | 5.46 | 5.45 |
| MgO | 0 | 0 | 0 | 1.86 | 1.82 | 1.79 | 0 | 0 |
| CaO | 6.25 | 6.36 | 6.47 | 2.58 | 2.53 | 2.49 | 6.24 | 6.23 |
| SrO | 0 | 0 | 0 | 2.38 | 2.35 | 2.30 | 0 | 0 |
| $B_2O_3$ | 0 | 0 | 0 | 0 | 0 | 0 | 1.02 | 2.04 |
| $Al_2O_3$ | 23.90 | 22.60 | 21.20 | 21.10 | 22.50 | 23.90 | 23.90 | 23.90 |
| $SiO_2$ | 54.20 | 55.20 | 56.10 | 55.90 | 55.00 | 54.00 | 53.20 | 52.30 |
| $SnO_2$ | 0.22 | 0.22 | 0.22 | 0.22 | 0.22 | 0.22 | 0.22 | 0.22 |
| $T_{str}$ (° C.) | 630 | 618 | 604 | 602 | 615 | 628 | 607 | 588 |
| $T_{ann}$ (° C.) | 684 | 669 | 655 | 653 | 669 | 683 | 659 | 639 |
| □ ($10^{-7}$/° C.) | 85.9 | 87.9 | 89 | 86.7 | 85.5 | 85.2 | 86.2 | 86.7 |
| □ (gm/cc) | 2.502 | 2.505 | 2.504 | 2.513 | 2.513 | 2.515 | 2.496 | 2.499 |
| $T_{200}$ (° C.) | 1622 | 1622 | | 1646 | 1645 | 1659 | 1613 | 1604 |
| $T_{liq}$ (° C.) | 1055 | 1085 | | 1035 | 1075 | 1120 | 1035 | 1025 |
| $h_{liq}$ (kP) | 448 | 194 | | 729 | 339 | 237 | 539 | 427 |

TABLE 6

| | Example | | | | | | | |
|---|---|---|---|---|---|---|---|---|
| | 20 | 21 | 22 | 23 | 24 | 25 | 26 | 27 |
| Composition (mol %) | | | | | | | | |
| $Na_2O$ | 14.80 | 12.20 | 14.80 | 14.80 | 14.80 | 14.80 | 14.00 | 14.00 |
| $K_2O$ | 0.90 | 2.90 | 0 | 0 | 0.50 | 0 | 0 | 0 |
| MgO | 3.60 | 1.30 | 4.50 | 3.60 | 3.60 | 3.60 | 0 | 0 |
| CaO | 1.90 | 5.70 | 1.90 | 2.80 | 1.90 | 1.90 | 8.00 | 5.00 |
| SrO | 0 | 0 | 0 | 0 | 0.40 | 0.90 | 0 | 0 |
| ZnO | 0 | 0 | 0 | 0 | 0 | 0 | 0 | 0 |
| $B_2O_3$ | 0 | 0 | 0 | 0 | 0 | 0 | 0 | 0 |
| $Al_2O_3$ | 10.80 | 14.20 | 10.80 | 10.80 | 10.80 | 10.80 | 10.00 | 11.00 |
| $TiO_2$ | 0 | 0 | 0 | 0 | 0 | 0 | 0 | 0 |
| $ZrO_2$ | 0 | 0 | 0 | 0 | 0 | 0 | 0 | 0 |
| $SiO_2$ | 67.90 | 63.60 | 67.90 | 67.90 | 67.90 | 67.90 | 67.90 | 69.90 |
| $SnO_2$ | 0.10 | 0.10 | 0.10 | 0.10 | 0.10 | 0.10 | 0.10 | 0.10 |
| Composition (wt %) | | | | | | | | |
| $Na_2O$ | 14.20 | 11.30 | 14.30 | 14.30 | 14.20 | 14.20 | 13.50 | 13.30 |
| $K_2O$ | 1.32 | 4.09 | 0 | 0 | 0.73 | 0 | 0 | 0 |
| MgO | 2.25 | 0.78 | 2.83 | 2.26 | 2.25 | 2.25 | 0 | 0 |
| CaO | 1.65 | 4.78 | 1.67 | 2.45 | 1.65 | 1.65 | 6.98 | 4.33 |
| SrO | 0 | 0 | 0 | 0 | 0.64 | 1.44 | 0 | 0 |
| ZnO | 0 | 0 | 0 | 0 | 0 | 0 | 0 | 0 |
| $B_2O_3$ | 0 | 0 | 0 | 0 | 0 | 0 | 0 | 0 |
| $Al_2O_3$ | 17.10 | 21.70 | 17.20 | 17.20 | 17.10 | 17.10 | 15.90 | 17.30 |
| $TiO_2$ | 0 | 0 | 0 | 0 | 0 | 0 | 0 | 0 |
| $ZrO_2$ | 0 | 0 | 0 | 0 | 0 | 0 | 0 | 0 |
| $SiO_2$ | 63.30 | 57.20 | 63.70 | 63.60 | 63.20 | 63.20 | 63.50 | 64.80 |
| $SnO_2$ | 0.23 | 0.23 | 0.24 | 0.23 | 0.23 | 0.23 | 0.23 | 0.23 |
| $T_{str}$ (° C.) | 582 | 604 | 586 | 581 | 579 | 578 | 573 | 583 |
| $T_{ann}$ (° C.) | 632 | 658 | 639 | 632 | 629 | 629 | 622 | 636 |
| $T_s$ | | | | | | | | |
| □ ($10^{-7}$/° C.) | 84.6 | 86.6 | 82.3 | 83 | 80.1 | 83.8 | 81 | 78.9 |
| □ (gm/cc) | 2.451 | 2.489 | 2.45 | 2.452 | 2.461 | 2.469 | 2.489 | 2.455 |

TABLE 6-continued

|  | Example | | | | | | | |
|---|---|---|---|---|---|---|---|---|
|  | 20 | 21 | 22 | 23 | 24 | 25 | 26 | 27 |
| $T_{200}$ (° C.) | 1652 | 1646 | 1633 | 1623 | 1631 | 1635 |  | 1656 |
| $T_{liq}$ (° C.) | 990 | 1025 | 1040 | 1040 | 985 | 1010 | 1130 | 1070 |
| $h_{liq}$ (kP) | 765 | 771 | 360 | 261 | 558 | 552 |  | 157 |

TABLE 7

|  | Example | | | | | | | |
|---|---|---|---|---|---|---|---|---|
|  | 28 | 29 | 30 | 31 | 32 | 33 | 34 | 35 |
| Composition (mol %) | | | | | | | | |
| $Na_2O$ | 14.00 | 14.80 | 14.00 | 14.00 | 11.50 | 12.50 | 14.80 | 14.00 |
| $K_2O$ | 0 | 0 | 0 | 0 | 3.9 | 3.9 | 0 | 0 |
| MgO | 2.00 | 2.75 | 0 | 2.00 | 0 | 0 | 3.60 | 0 |
| CaO | 2.00 | 1.45 | 4.00 | 2.00 | 7.60 | 7.60 | 1.90 | 0 |
| SrO | 1.00 | 0.70 | 0 | 1.00 | 0 | 0 | 0.90 | 5.00 |
| ZnO | 0 | 0 | 0 | 0 | 0 | 0 | 0 | 0 |
| $B_2O_3$ | 0 | 0 | 0 | 0 | 0 | 0 | 0 | 0 |
| $Al_2O_3$ | 11.00 | 12.30 | 12.00 | 11.00 | 16.00 | 16.00 | 10.80 | 11.00 |
| $TiO_2$ | 0 | 0 | 0 | 2.00 | 0 | 0 | 0 | 0 |
| $ZrO_2$ | 0 | 0 | 0 | 0 | 0 | 0 | 1.50 | 0 |
| $SiO_2$ | 69.90 | 67.90 | 69.90 | 67.90 | 60.90 | 59.90 | 66.40 | 69.90 |
| $SnO_2$ | 0.10 | 0.10 | 0.10 | 0.10 | 0.10 | 0.10 | 0.10 | 0.10 |
| Composition (wt %) | | | | | | | | |
| $Na_2O$ | 13.30 | 14.00 | 13.30 | 13.20 | 10.40 | 11.30 | 14.00 | 12.90 |
| $K_2O$ | 0 | 0 | 0 | 0 | 5.39 | 5.39 | 0 | 0 |
| MgO | 1.24 | 1.70 | 0 | 1.23 | 0 | 0 | 2.22 | 0 |
| CaO | 1.73 | 1.25 | 3.44 | 1.72 | 6.26 | 6.26 | 1.63 | 0 |
| SrO | 1.59 | 1.11 | 0 | 1.58 | 0 | 0 | 1.42 | 7.70 |
| ZnO | 0 | 0 | 0 | 0 | 0 | 0 | 0 | 0 |
| $B_2O_3$ | 0 | 0 | 0 | 0 | 0 | 0 | 0 | 0 |
| $Al_2O_3$ | 17.30 | 19.20 | 18.70 | 17.20 | 24.00 | 23.90 | 16.80 | 16.70 |
| $TiO_2$ | 0 | 0 | 0 | 2.44 | 0 | 0 | 0 | 0 |
| $ZrO_2$ | 0 | 0 | 0 | 0 | 0 | 0 | 2.82 | 0 |
| $SiO_2$ | 64.60 | 62.50 | 64.30 | 62.40 | 53.70 | 52.80 | 60.90 | 62.40 |
| $SnO_2$ | 0.23 | 0.23 | 0.23 | 0.23 | 0.22 | 0.22 | 0.22 | 0.22 |
| $T_{str}$ (° C.) | 585 | 602 | 599 | 595 | 626 | 624 | 614 | 570 |
| $T_{ann}$ (° C.) | 639 | 656 | 654 | 641 | 678 | 669 | 662 | 618 |
| $T_s$ | | | | | | | | |
| □ ($10^{-7}$/° C.) | 77.6 | 79.6 | 77.8 | 78.4 | 88.9 | 91.4 | 79 | 79.1 |
| □ (gm/cc) | 2.458 | 2.455 | 2.44 | 2.479 | 2.51 | 2.516 | 2.516 | 2.536 |
| $T_{200}$ (° C.) | 1681 | 1682 | 1725 |  |  |  | 1605 |  |
| $T_{liq}$ (° C.) | 1030 | 1040 | 1040 | 1035 | 1080 | 1110 | 1010 | 1060 |
| $h_{liq}$ (kP) | 536 | 790 | 848 |  |  |  | 910 |  |

TABLE 8

|  | Example | | | | | | | |
|---|---|---|---|---|---|---|---|---|
|  | 36 | 37 | 38 | 39 | 40 | 41 | 42 | 43 |
| Composition (mol %) | | | | | | | | |
| $Na_2O$ | 14.00 | 16.00 | 14.00 | 13.00 | 13.00 | 13.00 | 13.00 | 13.00 |
| $K_2O$ | 0 | 0 | 0 | 0 | 0 | 0 | 0 | 0 |
| MgO | 0 | 5.00 | 4.50 | 4.00 | 3.50 | 3.50 | 3.00 | 5.90 |
| CaO | 0 | 0 | 0 | 4.00 | 3.50 | 3.50 | 3.00 | 0 |
| SrO | 0 | 0 | 0 | 0 | 0 | 0 | 0 | 0 |
| ZnO | 5.00 | 0 | 0 | 0 | 0 | 0 | 0 | 0 |
| $B_2O_3$ | 0 | 0 | 0 | 0 | 1.00 | 0 | 0 | 0 |
| $Al_2O_3$ | 11.00 | 9.00 | 8.20 | 10.00 | 9.00 | 10.00 | 9.00 | 8.08 |
| $TiO_2$ | 0 | 0 | 0 | 0 | 0 | 0 | 0 | 0 |
| $ZrO_2$ | 0 | 0 | 0 | 0 | 0 | 0 | 0 | 0 |
| $SiO_2$ | 69.90 | 70.00 | 73.50 | 69.00 | 70.00 | 70.00 | 72.00 | 73.00 |
| $SnO_2$ | 0.10 | 0.10 | 0.10 | 0.10 | 0.10 | 0.10 | 0.10 | 0.10 |
| Composition (wt %) | | | | | | | | |
| $Na_2O$ | 13.10 | 15.61 | 13.70 | 12.60 | 12.64 | 12.58 | 12.64 | 12.81 |
| $K_2O$ | 0 | 0 | 0 | 0 | 0 | 0 | 0 | 0 |

TABLE 8-continued

|  | Example | | | | | | | |
|---|---|---|---|---|---|---|---|---|
|  | 36 | 37 | 38 | 39 | 40 | 41 | 42 | 43 |
| MgO | 0 | 3.18 | 2.87 | 2.53 | 2.22 | 2.21 | 1.9 | 3.81 |
| CaO | 0 | 0 | 0 | 3.52 | 3.09 | 3.08 | 2.65 | 0 |
| SrO | 0 | 0 | 0 | 0 | 0 | 0 | 0 | 0 |
| ZnO | 6.16 | 0 | 0 | 0 | 0 | 0 | 0 | 0 |
| $B_2O_3$ | 0 | 0 | 0 | 0 | 1.11 | 0 | 0 | 0 |
| $Al_2O_3$ | 17.00 | 14.49 | 13.24 | 16.00 | 14.44 | 15.97 | 14.44 | 13.14 |
| $TiO_2$ | 0 | 0 | 0 | 0 | 0 | 0 | 0 | 0 |
| $ZrO_2$ | 0 | 0 | 0 | 0 | 0 | 0 | 0 | 0 |
| $SiO_2$ | 63.50 | 66.43 | 69.92 | 65.06 | 66.22 | 65.87 | 68.08 | 69.95 |
| $SnO_2$ | 0.23 | 0.24 | 0.24 | 0.24 | 0.24 | 0.24 | 0.24 | 0.24 |
| $T_{str}$ (° C.) | 617 | 570 | 580 | 600 | 572 | 594 | 578 | 592 |
| $T_{ann}$ (° C.) | 671 | 621 | 634 | 650 | 620 | 646 | 631 | 650 |
| $T_s$ |  | 854 | 886 | 880 | 851 | 888 | 878 | 915 |
| □ ($10^{-7}$/° C.) |  | 82.9 | 76.6 | 74.3 | 75.8 | 74.1 | 73 | 71.5 |
| □ (gm/cc) | 2.497 | 2.429 | 2.392 | 2.457 | 2.443 | 2.445 | 2.432 | 2.404 |
| $T_{200}$ (° C.) |  | 1641 | 1731 | 1641 | 1637 | 1664 | 1678 | 1687 |
| $T_{liq}$ (° C.) | 1010 | 970 | 985 | 1105 | 1050 | 1090 | 1050 | 1030 |
| $h_{liq}$ (kP) |  | 1223 | 2127 | 104 | 177 | 178 | 338 | 668 |

TABLE 9

|  | Example | | |
|---|---|---|---|
|  | 44 | 45 | 46 |
| Composition (mol %) | | | |
| $Na_2O$ | 15.00 | 15.34 | 11.90 |
| $K_2O$ | 0 | 0 | 0 |
| MgO | 0 | 0 | 5.00 |
| CaO | 3.40 | 0.59 | 0 |
| SrO | 0 | 0 | 0 |
| ZnO | 0 | 0 | 0 |
| $B_2O_3$ | 0 | 5.00 | 2.00 |
| $Al_2O_3$ | 11.50 | 16.03 | 9.00 |
| $TiO_2$ | 0 | 0 | 0 |
| $ZrO_2$ | 0 | 0 | 0 |
| $SiO_2$ | 70.00 | 62.94 | 72.00 |
| $SnO_2$ | 0.10 | 0.10 | 0.10 |
| Composition (wt %) | | | |
| $Na_2O$ | 14.23 | 14.02 | 11.6 |
| $K_2O$ | 0 | 0 | 0 |
| MgO | 0 | 0 | 3.18 |
| CaO | 2.93 | 0.49 | 0 |
| SrO | 0 | 0 | 0 |
| ZnO | 0 | 0 | 0 |
| $B_2O_3$ | 0 | 5.15 | 2.20 |
| $Al_2O_3$ | 18.00 | 24.17 | 14.48 |
| $TiO_2$ | 0 | 0 | 0 |
| $ZrO_2$ | 0 | 0 | 0 |
| $SiO_2$ | 64.57 | 55.92 | 68.26 |
| $SnO_2$ | 0.23 | 0.23 | 0.23 |
| $T_{str}$ (° C.) | 589 | 609 | 591 |
| $T_{ann}$ (° C.) | 638 | 668 | 645 |
| $T_s$ | 876 | 954 | 918 |
| □ ($10^{-7}$/° C.) | 80 | 80.7 | 68.1 |
| □ (gm/cc) | 2.445 | 2.405 | 2.395 |
| $T_{200}$ (° C.) |  |  |  |
| $T_{liq}$ (° C.) | 1010 | none | 1110 |
| $h_{liq}$ (kP) |  |  |  |

TABLE 10

|  | Example | | | | | |
|---|---|---|---|---|---|---|
|  | 47 | 48 | 49 | 50 | 51 | 52 |
| Composition (mol %) | | | | | | |
| $Na_2O$ | 14.80 | 14.85 | 14.88 | 14.80 | 14.80 | 14.80 |
| MgO | 3.60 | 1.38 | 0.69 | 3.85 | 3.60 | 3.30 |
| CaO | 1.90 | 3.73 | 4.86 | 2.05 | 1.90 | 1.75 |
| SrO | 0.90 | 0.35 | 0.18 | 1.00 | 0.90 | 0.85 |
| $Al_2O_3$ | 10.80 | 13.15 | 13.58 | 12.30 | 12.80 | 13.30 |
| $ZrO_2$ | 1.00 | 0 | 0 | 0 | 0 | 0 |
| $SiO_2$ | 66.90 | 66.44 | 65.71 | 65.90 | 65.90 | 65.90 |
| $SnO_2$ | 0.10 | 0.10 | 0 | 0.10 | 0.10 | 0.10 |
| Composition (wt %) | | | | | | |
| $Na_2O$ | 14.00 | 14.00 | 14.00 | 14.00 | 14.00 | 13.90 |
| MgO | 2.23 | 0.85 | 0.42 | 2.38 | 2.22 | 2.03 |
| CaO | 1.63 | 3.19 | 4.14 | 1.76 | 1.63 | 1.49 |
| SrO | 1.43 | 0.55 | 0.28 | 1.59 | 1.43 | 1.34 |
| $Al_2O_3$ | 16.90 | 20.40 | 21.00 | 19.20 | 20.00 | 20.70 |
| $ZrO_2$ | 1.89 | 0 | 0 | 0 | 0 | 0 |
| $SiO_2$ | 61.60 | 60.80 | 59.90 | 60.70 | 60.50 | 60.30 |
| $SnO_2$ | 0.23 | 0.23 | 0.23 | 0.23 | 0.23 | 0.23 |
| $T_{str}$ (° C.) | 607 | 612 | 616 | 606 | 621 | 623 |

TABLE 10-continued

|  | Example | | | | | |
|---|---|---|---|---|---|---|
|  | 47 | 48 | 49 | 50 | 51 | 52 |
| $T_{ann}$ (° C.) | 654 | 663 | 666 | 657 | 670 | 675 |
| Ts |  |  |  |  |  |  |
| $\alpha$ ($10^{-7}$/° C.) | 79.8 | 80.5 | 81.3 | 79.4 | 78.8 | 79.6 |
| $\rho$ (gm/cc) | 2.501 | 2.474 | 2.479 | 2.482 | 2.476 | 2.474 |
| $T_{200}$ (° C.) | 1628 |  |  | 1641 |  | 1668 |
| $T_{liq}$ (° C.) | 1015 | 1050 | 1045 | 1060 | 1070 | 1080 |
| $\eta_{liq}$ (kp) | 817 |  |  | 358 |  | 475 |

TABLE 11

|  | Example | | | | | |
|---|---|---|---|---|---|---|
|  | 53 | 54 | 55 | 56 | 57 | 58 |
| Composition (mol %) | | | | | | |
| Na$_2$O | 13.50 | 14.90 | 13.19 | 14.90 | 15.58 | 16.93 |
| K$_2$O | 0 | 0 | 0.98 | 0 | 0 | 0 |
| MgO | 0 | 0 | 5.68 | 0 | 0 | 0 |
| CaO | 4.50 | 6.00 | 1.17 | 2.00 | 4.92 | 1.60 |
| SrO | 0 | 0 | 0.38 | 0 | 0 | 0 |
| ZnO | 0 | 0 | 0 | 4.00 | 0 | 0 |
| Al$_2$O$_3$ | 12.00 | 14.00 | 9.50 | 14.00 | 15.34 | 18.57 |
| ZrO$_2$ | 0 | 0 | 0 | 0 | 0 | 0 |
| SiO$_2$ | 70.00 | 65.00 | 67.31 | 65.00 | 64.09 | 58.80 |
| SnO$_2$ | 0.10 | 0 | 0.10 | 0.10 | 0.10 | 0.01 |
| Composition (wt %) | | | | | | |
| Na$_2$O | 12.77 | 13.93 | 12.87 | 13.73 | 14.42 | 15.25 |
| K$_2$O | 0 | 0 | 1.46 | 0 | 0 | 0 |
| MgO | 0 | 0 | 3.62 | 0 | 0 | 0 |
| CaO | 3.86 | 5.09 | 1.04 | 1.67 | 4.14 | 1.31 |
| SrO | 0 | 0 | 0.62 | 0 | 0 | 0 |
| ZnO | 0 | 0 | 0 | 4.85 | 0 | 0 |
| Al$_2$O$_3$ | 18.72 | 21.60 | 15.29 | 21.28 | 23.44 | 27.6 |
| ZrO$_2$ | 0 | 0 |  | 0 | 0 | 0 |
| SiO$_2$ | 64.38 | 59.10 | 63.87 | 58.23 | 57.67 | 51.5 |
| SnO$_2$ | 0.23 | 0.23 | 0.23 | 0.23 | 0.23 | 0.23 |
| $T_{str}$ (° C.) | 613 | 619 | 588 | 623 | 636 | 617 |
| $T_{ann}$ (° C.) | 666 | 669 | 637 | 675 | 686 | 675 |
| Ts | 911 | 899 | 872 | 924 | 919 | 937 |
| $\alpha$ ($10^{-7}$/° C.) | 75.6 | 81.6 | 80.1 | 79.4 | 82.4 | 83.1 |
| $\rho$ (gm/cc) | 2.449 | 2.484 | 2.549 | 2.519 | 2.482 | 2.442 |
| $T_{200}$ (° C.) | 1744 | 1641 |  |  | 1679 | 1634 |
| $T_{liq}$ (° C.) | 1040 | 1050 | 1000 | 1035 | 1040 | 1050 |
| $\eta_{liq}$ (kp) | 985 | 521 |  |  | 1927 | 1279 |

TABLE 12

|  | Example | | | | | |
|---|---|---|---|---|---|---|
|  | 59 | 60 | 61 | 62 | 63 | 64 |
| Composition (mol %) | | | | | | |
| Na$_2$O | 12.57 | 12.27 | 10.77 | 11.07 | 10.82 | 11.58 |
| K$_2$O | 2.30 | 2.24 | 2.24 | 3.44 | 2.79 | 2.30 |
| MgO | 4.81 | 4.69 | 4.69 | 3.39 | 3.64 | 6.20 |
| CaO | 2.60 | 2.00 | 3.00 | 3.15 | 3.15 | 0.60 |
| SrO | 0 | 1.00 | 1.50 | 1.56 | 1.56 | 0 |
| ZnO | 0 | 0 | 0 | 0 | 0 | 0 |
| Al$_2$O$_3$ | 8.70 | 10.44 | 10.44 | 12.15 | 11.30 | 7.61 |
| ZrO$_2$ | 0 | 0 | 0 | 0 | 0 | 0 |
| SiO$_2$ | 68.82 | 67.16 | 67.16 | 65.13 | 66.63 | 71.51 |
| SnO$_2$ | 0.20 | 0.20 | 0.20 | 0.10 | 0.10 | 0.20 |
| Composition (wt %) | | | | | | |
| Na$_2$O | 12.17 | 11.65 | 10.20 | 10.28 | 10.14 | 11.32 |
| K$_2$O | 3.39 | 3.24 | 3.24 | 4.87 | 3.99 | 3.43 |
| MgO | 3.04 | 2.91 | 2.90 | 2.05 | 2.23 | 3.96 |
| CaO | 2.28 | 1.72 | 2.58 | 2.66 | 2.68 | 0.53 |

TABLE 12-continued

| | Example | | | | | |
|---|---|---|---|---|---|---|
| | 59 | 60 | 61 | 62 | 63 | 64 |
| SrO | 0 | 1.59 | 2.38 | 2.43 | 2.45 | 0 |
| ZnO | 0 | 0 | 0 | 0 | 0 | 0 |
| $Al_2O_3$ | 13.88 | 16.36 | 16.32 | 18.62 | 17.48 | 12.27 |
| $ZrO_2$ | 0 | 0 | 0 | 0 | 0 | 0 |
| $SiO_2$ | 64.73 | 62.01 | 61.86 | 58.80 | 60.74 | 67.97 |
| $SnO_2$ | 0.47 | 0.46 | 0.46 | 0.23 | 0.23 | 0.48 |
| $T_{str}$ (° C.) | 560 | 584 | 598 | 592 | 593 | 571 |
| $T_{ann}$ (° C.) | 610 | 634 | 648 | 642 | 644 | 622 |
| Ts | 837.6 | 866.1 | 876.6 | 871.8 | 876.8 | 866.8 |
| $\square$ ($10^{-7}$/° C.) | 86.5 | 85.2 | 81.2 | 88.3 | 84.9 | 82.4 |
| $\square$ (gm/cc) | 2.459 | 2.483 | 2.498 | 2.507 | 2.500 | 2.428 |
| $T_{200}$ (° C.) | 1629 | 1641 | 1650 | 1630 | 1663 | 1677 |
| $T_{liq}$ (° C.) | 1005 | 1040 | 1090 | 1040 | 1070 | 915 |
| $\square_{liq}$ (kp) | 370 | 384 | 143 | 338 | 282 | 4800 |

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A glass consisting essentially of in weight percent:
   50 to 72 percent $SiO_2$;
   greater than 15 to 25% percent $Al_2O_3$;
   0 to 10 percent $B_2O_3$;
   10 to 25 percent total $M_2O$; and
   2 to 25 percent total RO;
   wherein M is an alkali metal selected from Na, K, Li, Rb, and Cs, wherein the glass has at least 9 weight percent $Na_2O$ and 5 weight percent or less $K_2O$, wherein R is an alkaline earth metal selected from Mg, Ca, Ba, and Sr, and MgO is less than 2.5%,
   wherein the glass has a strain point of 535° C. or greater, a coefficient of thermal expansion of $50\times10^{-7}$ or greater, and a liquidus viscosity of 130,000 poise or greater.

2. The glass of claim 1, having 0-3 weight percent $K_2O$.

3. The glass of claim 1, substantially free of $K_2O$.

4. The glass of claim 1, having 2 to less than 14 weight percent RO.

5. The glass of claim 1, having 55 to 72 weight percent $SiO_2$.

6. The glass of claim 1, having 9 to 17 weight percent $Na_2O$.

7. The glass of claim 1, having no $ZrO_2$.

8. The glass of claim 1, consisting of $SiO_2$, $Al_2O_3$, $M_2O$, and RO.

9. The glass of claim 1, consisting of $SiO_2$, $Al_2O_3$, $M_2O$, $B_2O_3$, and RO.

10. The glass of claim 1, substantially free of BaO.

11. The glass of claim 1, having a liquidus viscosity of 150,000 poise or greater, and a coefficient of thermal expansion of from $50\times10^{-7}$ to $90\times10^{-7}$.

12. A photovoltaic device comprising a substrate or superstrate and an active photovoltaic medium adjacent to the substrate of superstrate, wherein the substrate or superstrate is in the form of a sheet comprising the glass composition of claim 1.

13. The photovoltaic device of claim 12, wherein the active photovoltaic medium comprises copper indium gallium diselenide.

14. The photovoltaic device of claim 12, wherein the active photovoltaic medium comprises cadmium telluride.

15. A glass consisting essentially of in weight percent:
   50 to 72 percent $SiO_2$;
   greater than 15 to 25% percent $Al_2O_3$;
   0 to 10 percent $B_2O_3$;
   10 to 25 percent total $M_2O$; and
   2 to 25 percent total RO;
   wherein M is an alkali metal selected from Na, K, Li, Rb, and Cs, wherein the glass has at least 9 weight percent $Na_2O$, wherein R is an alkaline earth metal selected from Mg, Ca, Ba, and Sr, and is substantially free of $K_2O$,
   wherein the glass has a strain point of 535° C. or greater, a coefficient of thermal expansion of $50\times10^{-7}$ or greater, and a liquidus viscosity of 130,000 poise or greater.

16. The glass of claim 15, having 2 to less than 14 weight percent RO.

17. The glass of claim 15, having less than 2.5 weight percent MgO.

18. The glass of claim 15, having 55 to 72 weight percent $SiO_2$.

19. The glass of claim 15, having 9 to 17 weight percent $Na_2O$.

20. The glass of claim 15, having no $ZrO_2$.

21. The glass of claim 15, consisting of $SiO_2$, $Al_2O_3$, $M_2O$, and RO.

22. The glass of claim 15, consisting of $SiO_2$, $Al_2O_3$, $M_2O$, $B_2O_3$, and RO.

23. The glass of claim 15, substantially free of BaO.

24. The glass of claim 15, having a liquidus viscosity of 150,000 poise or greater, and a coefficient of thermal expansion of from $50\times10^{-7}$ to $90\times10^{-7}$.

25. A photovoltaic device comprising a substrate or superstrate and an active photovoltaic medium adjacent to the substrate of superstrate, wherein the substrate or superstrate is in the form of a sheet comprising the glass composition of claim 15.

26. The photovoltaic device of claim 25, wherein the active photovoltaic medium comprises copper indium gallium diselenide.

27. The photovoltaic device of claim 25, wherein the active photovoltaic medium comprises cadmium telluride.

\* \* \* \* \*

UNITED STATES PATENT AND TRADEMARK OFFICE
CERTIFICATE OF CORRECTION

| | |
|---|---|
| PATENT NO. | : 9,530,910 B2 |
| APPLICATION NO. | : 14/176500 |
| DATED | : December 27, 2016 |
| INVENTOR(S) | : Bruce Gardiner Aitken et al. |

It is certified that error appears in the above-identified patent and that said Letters Patent is hereby corrected as shown below:

On the Title Page

On page 2, in Column 1, item (56), Foreign Patent Documents, Line 12, delete "7/2000" and insert -- 12/2000 --, therefor.

Signed and Sealed this
Sixteenth Day of March, 2021

Drew Hirshfeld
*Performing the Functions and Duties of the
Under Secretary of Commerce for Intellectual Property and
Director of the United States Patent and Trademark Office*